US009343524B2

(12) United States Patent
Brain

(10) Patent No.: US 9,343,524 B2
(45) Date of Patent: *May 17, 2016

(54) ETCHSTOP LAYERS AND CAPACITORS

(71) Applicant: Intel Corporation, Santa Clara, CA (US)

(72) Inventor: Ruth A. Brain, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/732,593

(22) Filed: Jun. 5, 2015

(65) Prior Publication Data

US 2015/0270331 A1    Sep. 24, 2015

Related U.S. Application Data

(63) Continuation of application No. 13/977,647, filed as application No. PCT/US2011/059192 on Nov. 3, 2011, now Pat. No. 9,054,068.

(51) Int. Cl.
*H05K 1/00* (2006.01)
*H01L 49/02* (2006.01)
*H01L 21/311* (2006.01)
(Continued)

(52) U.S. Cl.
CPC .............. *H01L 28/60* (2013.01); *G06F 1/184* (2013.01); *H01L 21/02175* (2013.01); *H01L 21/02178* (2013.01); *H01L 21/02181* (2013.01); *H01L 21/02186* (2013.01); *H01L 21/31144* (2013.01); *H01L 21/76829* (2013.01); *H01L 21/76832* (2013.01); *H01L 21/76877* (2013.01); *H01L 23/5223* (2013.01); *H01L 23/5226* (2013.01); *H01L 23/5329* (2013.01); *H01L 27/1085* (2013.01); *H01L 27/10805* (2013.01);
(Continued)

(58) Field of Classification Search
CPC .................................. H05K 3/281; H05K 1/00
USPC .............................. 257/532; 361/750, 679.02
See application file for complete search history.

(56) References Cited

U.S. PATENT DOCUMENTS 6,048,445 A * 4/2000 Brain ........................ 205/118
6,365,514 B1 * 4/2002 Yu et al. .................... 438/675
(Continued)

FOREIGN PATENT DOCUMENTS

CN    1404126 A    3/2003
CN    1431698 A    7/2003
(Continued)

OTHER PUBLICATIONS

International Preliminary Report on Patentability received for PCT/US2011/059192 mailed on May 15, 2014, 4 pages.

(Continued)

*Primary Examiner* — Forrest M Phillips
(74) *Attorney, Agent, or Firm* — Blakely, Sokoloff, Taylor & Zafman LLP

(57) ABSTRACT

Capacitor structures for integrated circuit devices are provided. Capacitors include proximate dense or highly dense etchstop layers. The dense or highly dense etchstop layer is, for example, a high-k material. Capacitors are, for example, metal-insulator-metal (MIM) capacitors and are useful in DRAM (dynamic random access memory) and eDRAM (embedded dynamic random access memory) structures.

21 Claims, 7 Drawing Sheets

(51) Int. Cl.
  *H01L 23/522* (2006.01)
  *G06F 1/18* (2006.01)
  *H01L 21/768* (2006.01)
  *H01L 21/02* (2006.01)
  *H01L 23/532* (2006.01)
  *H01L 27/108* (2006.01)

(52) U.S. Cl.
  CPC ............... *H01L28/40* (2013.01); *H01L 28/90* (2013.01); *H01L 2924/0002* (2013.01)

(56) References Cited

U.S. PATENT DOCUMENTS

| | | | |
|---|---|---|---|
| 6,461,955 B1* | 10/2002 | Tsu et al. | 438/618 |
| 6,774,037 B2* | 8/2004 | Hussein et al. | 438/666 |
| 6,958,547 B2* | 10/2005 | Dubin et al. | 257/774 |
| 7,812,455 B2* | 10/2010 | King et al. | 257/774 |
| 8,039,920 B1 | 10/2011 | King et al. | |
| 8,058,177 B2* | 11/2011 | Weiss et al. | 438/701 |
| 8,441,097 B2 | 5/2013 | Steigerwald et al. | |
| 9,054,068 B2 | 6/2015 | Brain | |
| 2006/0024950 A1* | 2/2006 | Choi et al. | 438/626 |
| 2006/0154436 A1* | 7/2006 | Kim et al. | 438/396 |
| 2006/0163730 A1* | 7/2006 | Matsumoto et al. | 257/751 |
| 2007/0010085 A1 | 1/2007 | Tsai et al. | |
| 2007/0059913 A1* | 3/2007 | King et al. | 438/597 |
| 2008/0132030 A1* | 6/2008 | Yoon et al. | 438/435 |
| 2014/0002976 A1* | 1/2014 | Brain et al. | 361/679.02 |

FOREIGN PATENT DOCUMENTS

| | | |
|---|---|---|
| TW | 201131746 A | 9/2011 |
| WO | WO 2007/149709 A2 | 12/2007 |
| WO | WO 2013/066336 A1 | 5/2013 |

OTHER PUBLICATIONS

First Office Action for Chinese Patent Application No. 201180074601.1 dated Oct. 21, 2015.
Official Letter along with Search Report from the Intellectual Property Office for Taiwan Patent Application No. 101140773 dated Mar. 9, 2016.
First Office Action from the German Patent and Trademark Office for German Patent Application No. 112011015805.5 and English Translation thereof.

* cited by examiner

ETCHSTOP LAYERS AND CAPACITORS

This is a Continuation of application Ser. No. 13/977,647 filed Jun. 28, 2013 which is a U.S. National Phase Application under 35 U.S.C. §371 of International Application No. PCT/US2011/059192 filed Nov. 3, 2011.

BACKGROUND OF THE INVENTION

1. Field of the Invention

The embodiments of the invention relate generally to integrated circuit devices, semiconductor devices, metal interconnects, capacitors, and etchstop layers.

2. Background Information

The push toward ever-smaller more highly integrated circuit (IC) and other semiconductor devices places enormous demands on the techniques and materials used to construct the devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 32 nm. Components of IC chips include, for example, transistors such as CMOS (complementary metal-oxide-semiconductor) devices, capacitive structures (capacitors), resistive structures, and metal lines that provide electrical connections between components and external devices.

DETAILED DESCRIPTION OF THE INVENTION

Capacitors that are part of integrated circuit devices having proximate metal-containing and or high-k etchstop layers and methods of making these capacitors are provided. In embodiments of the invention, the proximate metal-containing and or high-k etchstop layer is a dense or highly dense dielectric layer. In embodiments of the invention, the proximate dense or ultra dense etch stop layer covers metal lines that are proximate to the capacitor during capacitor fabrication and remains in the IC device after fabrication.

Figure 1A:
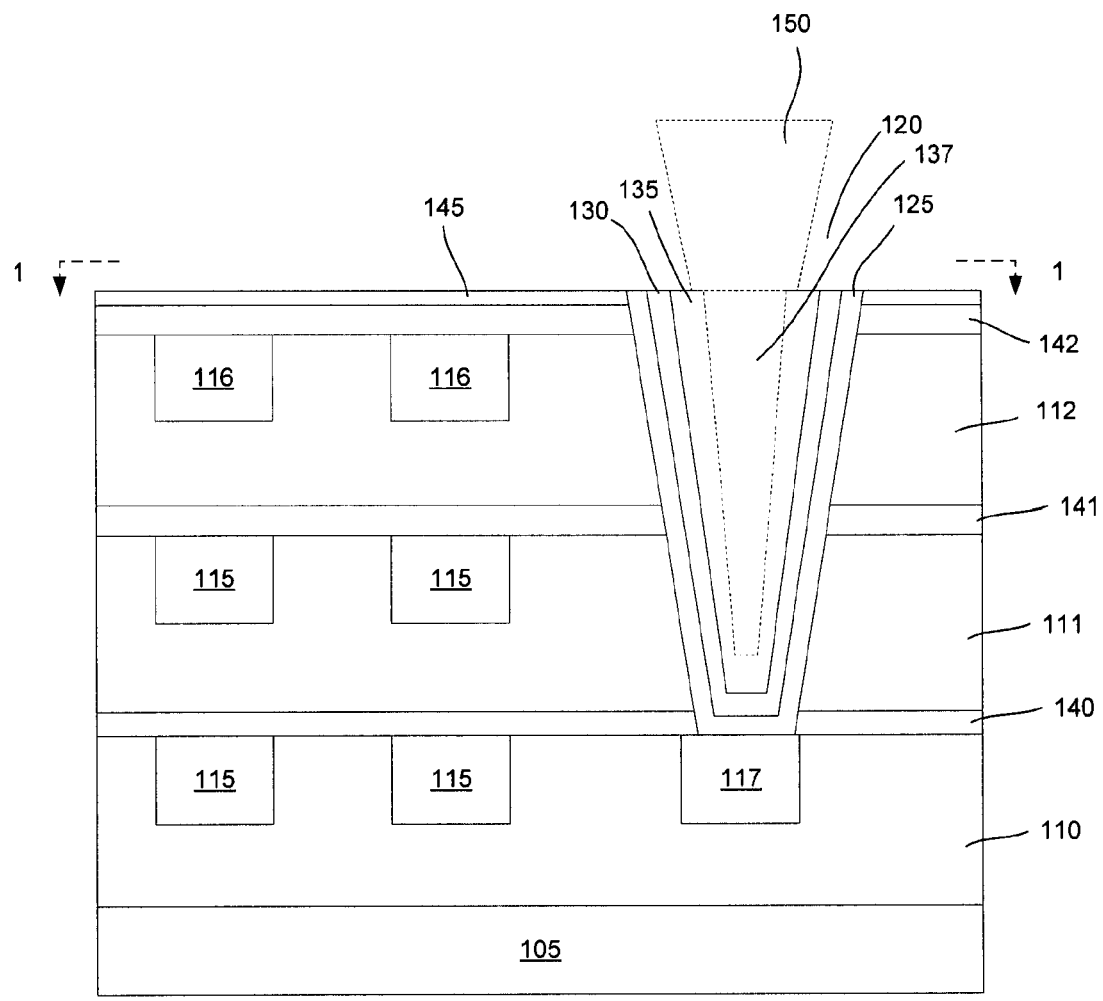
FIGS. 1A-B are schematic diagrams illustrating cross sectional views of capacitors and nearby structures that are parts of an integrated circuit chip.

FIG. 1A illustrates a capacitor structure that is a part of an integrated circuit chip. The capacitor is, for example, a MIM (metal-insulator-metal) capacitor. The components shown in FIG. 1A represent a very small section of a typical IC device. In FIG. 1A, a substrate 105 houses insulating layers 110-112 comprising metal-filled trenches 115-117. Insulating layers 110-112 comprise an insulating material, such as, for example, silicon dioxide, silicon nitride, carbon doped oxide (CDO), silicon oxynitride, organic polymers such as perfluorocyclobutane or polytetrafluoroethylene, fluorosilicate glass (FSG), and organosilicates such as silsesquioxane, siloxane, and or organosilicate glass. Metal trenches 115-117 are typically the conducting lines that interconnect the devices that form the IC chip. Metal-filled trenches 115-116 are optional parts of an IC device comprising capacitor 120, and other numbers and configuration of metal trenches are possible. In an embodiment the invention, at least one metal-filled trench 116 is proximate to an end of capacitor 120. In embodiments of the invention, metal line 117 electrically connects capacitor 120 to other components of a monolithic IC device. Other configurations are also possible for metal line 117, for example, the electrical interconnect that couples to a first end of capacitor 120 can be a via (not shown) that extends into substrate 105 electrically connecting capacitor 120 with other IC elements or devices (not shown). Metal lines 115-117, are comprised of, for example, copper, aluminum, silver, gold, platinum, or other conductive elements, or alloys thereof. In an embodiment of the invention, the metal lines 115-117 are comprised of copper. Capacitor 120 is formed in a well formed through insulating layers 111-112. Capacitor 120 comprises an outer conducting layer 125, an insulating layer 130, and an inner conducting region 135. The insulating layer 130 is disposed between the outer conducting layer 125 and the inner conducting region 135. The outer metal layer 125 and the inner conducting region 135 comprise, for example, a metal such as tantalum, tantalum nitride, titanium, titanium nitride, tungsten, or other conductive materials, and or alloys thereof. In an embodiment of the invention, the inner conducting region 130 can comprise one or more layers of conducting material (not shown), such as, a layer of tantalum proximate to the dielectric layer 130 and a metal fill comprised of copper that fills the remaining areas of the conducting region 135. The insulating layer 130 is comprised, in embodiments of the invention, of a high-k material. High-k materials include materials, such as, for example, silicon oxy-nitride, hafnium oxide, zirconium oxide, hafnium silicate, hafnium oxynitride, lanthanum oxide, and or similar high dielectric constant materials. The insulating layer 130 can also be comprised of $SiO_2$. In a further embodiment of the invention, conducting region 135 is a layer of conducting material within the conducting trench (as an alternative to a fill of conducting material) which is depicted by the dashed line within conducting region 135. In this alternative embodiment, insulating region 137 is present and comprises a dielectric material. This alternative is depicted in FIG. 1A but not in FIG. 1B.

Insulating layers 110-112 have dielectric etch stop layers 140-142 on at least one side. Etchstop layers 140-142 comprise an insulator, such as, for example, silicon nitride, silicon carbide, and silicon-carbon-nitride dielectric films. In embodiments of the invention, insulating layers 110-112 and etchstop layers 140-142 are films comprised of dielectric materials comprising at least 90% silicon, nitrogen, oxygen, and or carbon. Other configurations for insulating layers 110-112 and etchstop layers 140-142 are possible, such as, a single insulating layer comprised of layers 111 and 112 without the intervening etchstop layer 141. A dense or ultradense etchstop layer 145 is provided in proximity to an end of capacitor 120. In embodiments of the invention, the dense or ultradense etchstop layer 145 is provided on top of etchstop layer 142 during the fabrication of capacitor 120. During the fabrication of capacitor 120, the dense or ultradense etchstop layer 145 can protect the proximate underlying metal lines 116 from damage. The dense or ultradense etchstop layer 145 remains in the device after fabrication has been completed. In embodiments of the invention, the dense or ultradense etchstop layer 145 is denser than the proximate etchstop layer 143 that is a film comprised of silicon, nitrogen, oxygen, and or carbon. In further embodiments of the invention, the dense or ultradense etchstop layer 145 has a density that is greater than the density of etchstop layer 142, that is greater than 3 g/cm$^3$, greater than 4 g/cm$^3$, or greater than 5 g/cm$^3$, or in the range of 3 to 10 g/cm$^3$, 4 to 10 g/cm$^3$, or 5 to 10 g/cm$^3$. In embodiments of the invention, the etchstop layer 143 is a lower density etchstop layer and has a density of, for example, 2 to 3 g/cm$^3$. The dense or ultradense etchstop layer 145 has minimal dangling/broken bonds as compared to weakly more weakly bonded, lower-k etchstop layers. In additional embodiments of the invention, the dense or ultradense etchstop layer 145 is comprised of a high-k dielectric material. Useful high-k dielectric materials include transition metal oxides, such as, ZnO, HfO$_2$, Al$_2$O$_3$, and TiO$_x$ (wherein x is greater than zero and less than 2). In further embodiments of the invention, the dense or ultradense etchstop layer 145 is a dielectric material comprised of a transition metal. The dense or ultradense etchstop layer 145 can be a metal or transition metal oxide. The dense or ultradense etchstop layer 145 can be created, for example, using atomic vapor deposition processes. In embodiments of the invention the dense or ultradense etchstop layer 145 is 2-8 nm thick.

Additional manufacturing processes provide layers comprising trenches or vias 150 that electrically connect the conducting region 135 on an end of the capacitor 120 to other components of the IC chip. Materials that surround via 150, such as insulating layers, are not shown for clarity of description. In embodiments of the invention, capacitor 120 is part of a DRAM (dynamic random access memory) device or an eDRAM (embedded dynamic random access memory integrated on the same IC chip as ASIC (an application-specific integrated circuit) or a processor) and capacitor 120 is coupled to a transistor (not shown), typically through conducting line 117. Because eDRAM cells are periodically refreshed, a memory controller is typically included in the IC chip.

Figure 1B:
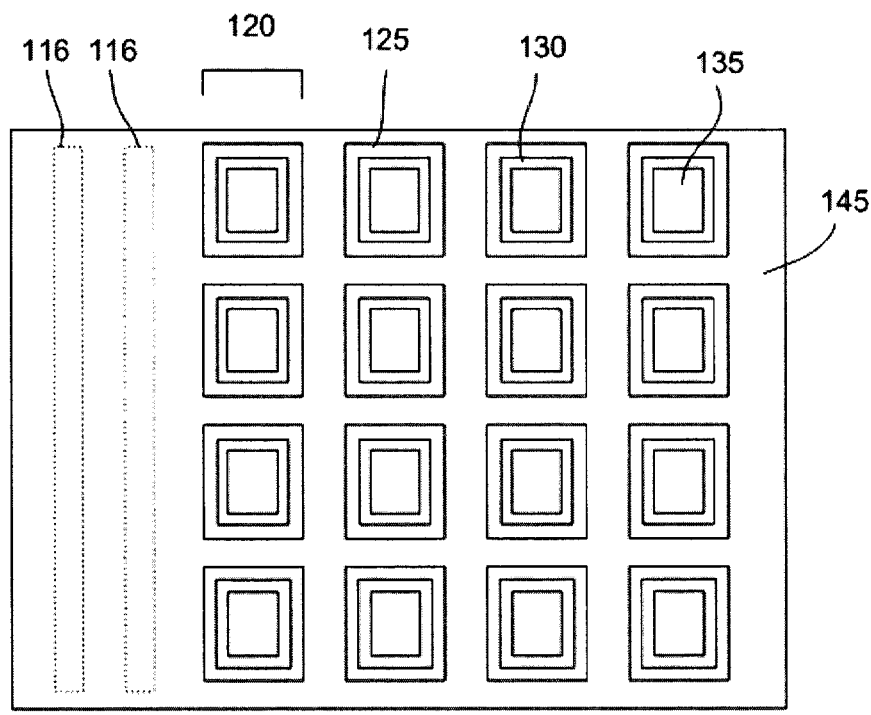

FIG. 1B is a view along 1-1 of the device of FIG. 1A and additionally includes an array of capacitors (whereas FIG. 1A only illustrated one capacitor). Although a 4×4 array of capacitors 120 are illustrated, other numbers and arrangements are also possible, and as in FIG. 1A, only a small portion of a full IC device is illustrated for clarity. In FIG. 1B, capacitors 120 comprise an outer conducting layer 125, an insulating layer 130, and an inner conducting region 135. The insulating layer 130 is disposed between the outer conducting layer 125 and the inner conducting region 135. Metal trenches 116 are disposed in this view behind the dense or ultradense etchstop layer 145, and are indicated with a dashed line.

Figure 2A:
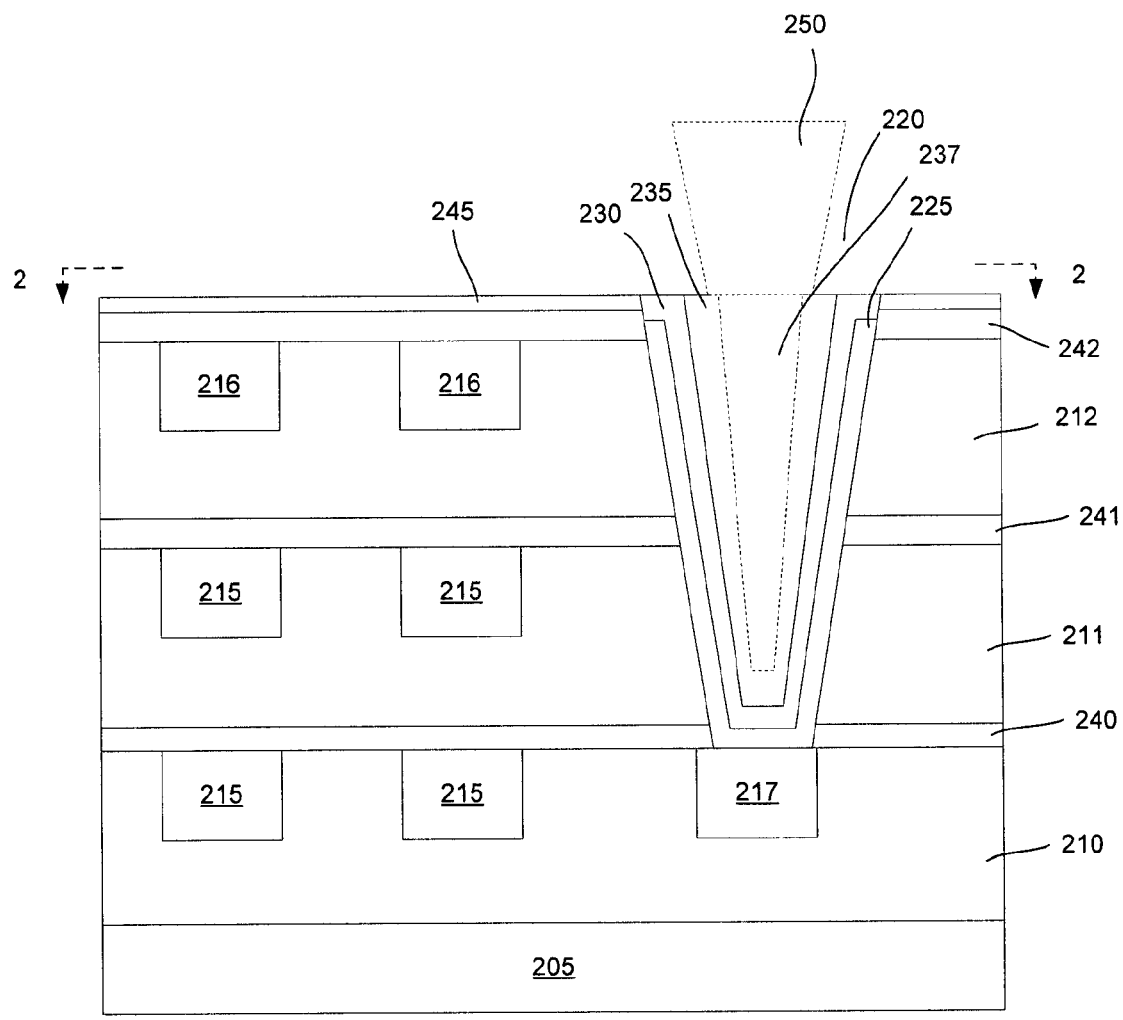
FIGS. 2A-B are schematic diagrams illustrating cross sectional views of additional capacitor structures and nearby structures that are parts of an integrated circuit chip.

FIG. 2A illustrates an additional capacitor structure. The capacitor is, for example, a MIM (metal-insulator-metal) capacitor. The capacitor and other components shown in FIG. 2A are part of an integrated circuit chip. The components shown in FIG. 2A represent a very small section of a typical IC device. In FIG. 2A, a substrate 205 houses insulating layers 210-212 comprising metal trenches 215-217. Insulating layers 210-212 comprise an insulating material, such as, for example, silicon dioxide, carbon doped oxide (CDO), silicon oxynitride, organic polymers such as perfluorocyclobutane or polytetrafluoroethylene, fluorosilicate glass (FSG), and organosilicates such as silsesquioxane, siloxane, and or organosilicate glass. Metal-filled trenches 215-217 are typically the conducting lines that interconnect the devices that form the IC chip. Metal-filled trenches 215-216 are optional parts of an IC device comprising capacitor 220, and other numbers and configuration of metal trenches are possible. In an embodiment the invention, at least one metal-filled trench 216 is proximate to capacitor 220. In embodiments of the invention, metal line 217 electrically connects capacitor 220 to other components of a monolithic IC device. Other configurations are also possible for metal line 217, for example, the electrical interconnect that couples to a first end of capacitor 220 can be a via (not shown) that extends into substrate 205 electrically connecting capacitor 220 with other IC elements or devices. Metal lines 215-217, are comprised of, for example, copper, aluminum, silver, gold, platinum, or other conductive elements, or alloys thereof. In an embodiment of the invention, the metal lines 215-217 are comprised of copper. Capacitor 220 is formed in a well formed through insulating layers 211-212. Capacitor 220 comprises an outer conducting layer 225, an insulating layer 230, and an inner conducting region 235. The insulating layer 230 is disposed between the outer conducting layer 225 and the inner conducting region 235. The outer conducting layer 225 is recessed within the well relative to the inner conducting layer 235. The outer metal layer 225 and the inner conducting region 235 comprise, for example, a metal such as tantalum, tantalum nitride, titanium, titanium nitride, tungsten, or other conductive material, and or alloys or mixtures thereof. In an embodiment of the invention, the inner conducting region 235 can comprise one or more layers of conducting material (not shown), such as, a layer of tantalum proximate to the dielectric layer 230 and a metal fill comprised of copper that fills the remaining areas of the conducting region 235. The insulating layer 230 is comprised, in embodiments of the invention, of a high-k material. High-k materials include materials, such as, for example, silicon oxynitride, hafnium oxide, zirconium oxide, hafnium silicate, hafnium oxynitride, lanthanum oxide, and or similar high dielectric constant materials. The insulating layer 230 can also be comprised of SiO$_2$. In further embodiments of the invention, conducting region 235 is a layer of conducting material within the conducting trench (as an alternative to a fill of conducting material) which is depicted by the dashed line within conducting region 235. In these alternative embodiments, insulating region 237 is present and comprises a dielectric material. This alternative is depicted in FIG. 2A but has been omitted from FIG. 2B for clarity of illustration.

Insulating layers 210-212 have etch stop layers 240-242 on at least one side. Etchstop layers 240-242 comprise an insulator, such as, for example, silicon nitride, silicon carbide, and silicon-carbon-nitride dielectric films. In embodiments of the invention, insulating layers 210-212 and etchstop layers 240-242 are films comprised of dielectric materials comprising at least 90% silicon, nitrogen, oxygen, and or carbon. Other configurations for insulating layers 210-212 and etchstop layers 240-242 are possible, such as, a single insulating layer comprised of layers 211 and 212 without the intervening etchstop layer 241. A dense or ultradense etchstop layer 245 is provided in proximity to an end of capacitor 220. In embodiments of the invention, the dense or ultradense etchstop layer 245 is provided on top of etchstop layer 242 during the fabrication of capacitor 220. During the fabrication of capacitor 220, the dense or ultradense etchstop layer 245 can protect the proximate underlying metal lines 216 from damage. The dense or ultradense etchstop layer 245 is proximate to the end of the capacitor 220 comprising the recessed area of outer conducting layer 225. The dense or ultradense etchstop layer 245 remains in the device after fabrication has been completed. In embodiments of the invention, the dense or ultradense etchstop layer 245 is denser than the proximate etchstop layer 243 that is a film comprised of silicon, nitrogen, oxygen, and or carbon. In further embodiments of the invention, the dense or ultradense etchstop layer 245 has a density that is greater than the density of etchstop layer 142, that is greater than 3 g/cm$^3$, greater than 4 g/cm$^3$, or greater than 5 g/cm$^3$, or in the range of 3 to 10 g/cm$^3$, 4 to 10 g/cm$^3$, or 5 to 10 g/cm$^3$. In embodiments of the invention, the etchstop layer 143 is a lower density etchstop layer and has a density of, for example, 2 to 3 g/cm$^3$. The dense or ultradense etchstop layer 145 has minimal dangling/broken bonds as compared to weakly more weakly bonded, lower-k etchstop layers. In additional embodiments of the invention, the dense or ultradense etchstop layer 245 is comprised of a high-k dielectric material. Useful high-k dielectric materials include transition metal oxides, such as, ZnO, HfO$_2$, Al$_2$O$_3$, and TiO$_x$ (wherein x is greater than zero and less than 2). In further embodiments of the invention, the dense or ultradense etchstop layer 245 is a dielectric material comprised of a transition metal. The dense or ultradense etchstop layer 245 can be a metal or transition metal oxide. The dense or ultradense etchstop layer 245 can be created, for example, using atomic vapor deposition processes. In embodiments of the invention the dense or ultradense etchstop layer 245 is 2-8 nm thick.

During fabrication of the structure of FIG. 2A, after the metal lines 216 are patterned and filled, the etchstop layer 242 and dense or ultradense etchstop 245 layer are deposited, the capacitor trench is created through these films and lands on an underlying metal line 217 (or 215 or other layer). Then the conductive bottom electrode 225 is deposited and the surface of the structure is polished to remove the excess bottom electrode material. A sacrificial material is deposited into the capacitor trench (such as a SLAM material (a sacrificial light absorbing material) and removed from the structure surface using a chemical mechanical polish (CMP) to stop on the bottom electrode 225, and then a dry-etch is performed to recess the bottom electrode 225. In general, the SLAM can be comprised of a material having polymetric backbone. For example, the SLAM can comprise a poly (norbornene) backbone which can includes a side group which can be modified to allow the modulation of the SLAM etch rate. The side group can be an aromatic or cage moiety (such as adamantyl) for decreasing the etch rate or a fluorine-containing moiety (such as —CR$_3$ or —C$_2$F$_5$) for increasing the etch rate. The SLAM can also be comprised, for example of a siloxane-containing polymer material.

Additional manufacturing processes provide layers comprising trenches or vias 250 that electrically connect the conducting region 235 on an end of the capacitor 220 to other components of the IC chip. Materials that surround via 250, such as insulating layers, are not shown for clarity of description. In embodiments of the invention, capacitor 220 is part of a DRAM (dynamic random access memory) device or an eDRAM (embedded dynamic random access memory integrated on the same IC chip as ASIC (an application-specific integrated circuit) or a processor) and capacitor 220 is coupled to a transistor (not shown), typically through conducting line 217. Because eDRAM cells are periodically refreshed, a memory controller is typically included in the IC chip housing the eDRAM cells.

Figure 2B:
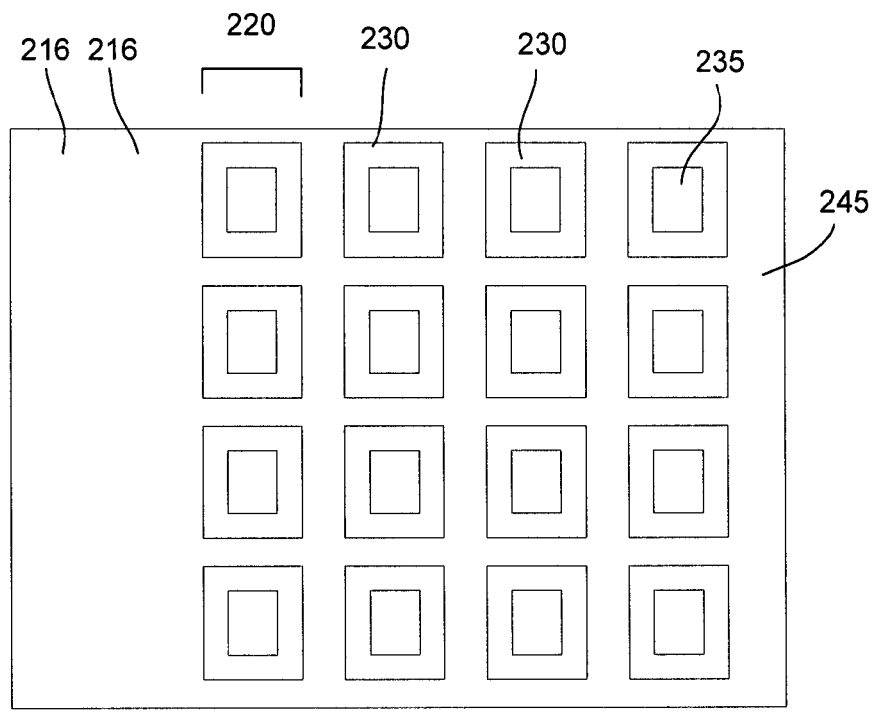

FIG. 2B is a view along 2-2 of the device of FIG. 2A and additionally includes an array of capacitors (whereas FIG. 2A illustrated one capacitor). Although a 4×4 array of capacitors 220 are illustrated, other numbers and arrangements are also possible, and as in FIG. 2A, only a small portion of a full IC device is illustrated for clarity. In FIG. 2B, capacitors 220 comprise an outer conducting layer 225 (indicted by dotted lines), an insulating layer 230, and an inner conducting region 235. The insulating layer 230 covers the outer conducting layer 225 (which is indicated by dashed lines). Metal trenches 216 are disposed in this view behind the dense or ultradense etchstop layer 245, and are indicated with a dashed line.

Figure 3:
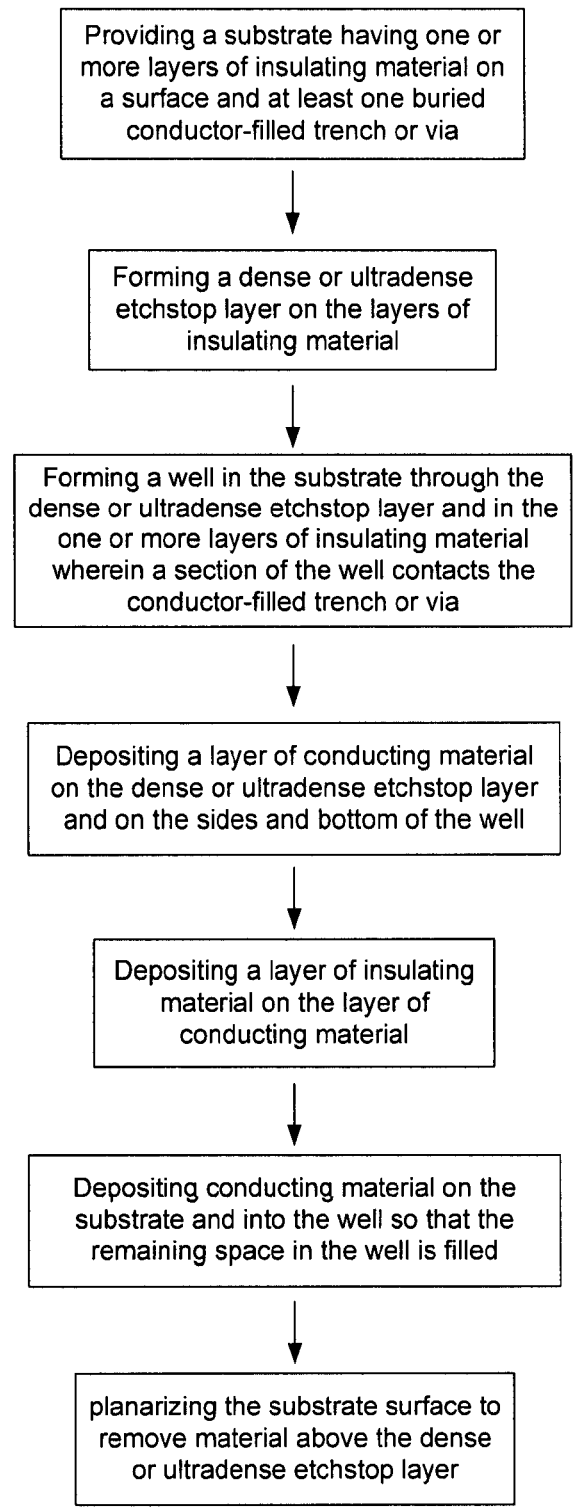
FIG. 3 describes a method for making a capacitor that is part of an IC device.

FIG. 3 describes a process for constructing capacitors in IC chips according to embodiments of the invention. In FIG. 3, a substrate is provided that has at least one layer of insulating material and at least one metal-filled trench or via. In embodiments of the invention there are additional metal-filled trenches or vias proximate to the surface of the insulating material. Optionally, there is also an etch-stop layer on the surface of the insulating material. A dense or ultradense etchstop layer as described herein is deposited on the insulating material or etchstop layer. In embodiments of the invention, the dense or ultradense etchstop layer is deposited by atomic vapor deposition. A well is then formed through the dense or ultradense etchstop layer and the optional conventional etchstop layer in the insulating material. The well makes contact with the at least one metal-filled trench or via. Layers of conducting material, insulating material, and conducting material are then sequentially deposited. The final conducting material is deposited at a thickness that fills the well. The surface of the substrate is then planarized down to the dense or ultradense etchstop layer leaving the dense or ultradense etchstop layer on the surface of the substrate. The substrate surface also comprises an outlet side of the capacitor structure that has been formed. The outlet side of the capacitor comprises a surface of the formed inner conducting region of the capacitor that is capable of making electrical contact with additional conducting regions (such as trenches or vias) that are subsequently formed on the substrate surface that comprises the dense or ultradense etchstop layer. The substrate undergoes further processing to form additional structures on the substrate surface.

Figure 4:
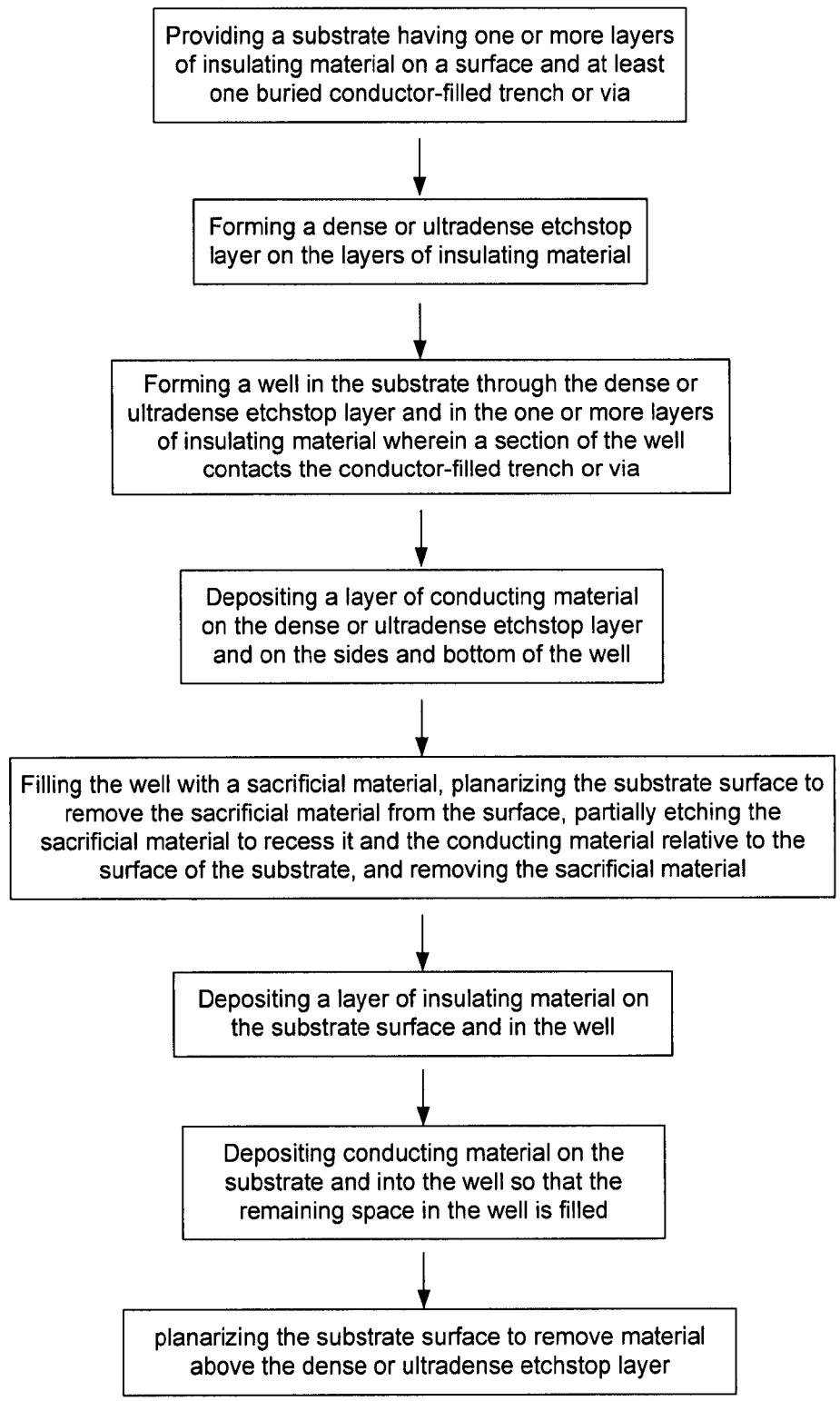
FIG. 4 describes an additional method for making a capacitor that is part of an IC device.

FIG. 4 describes an additional process for constructing capacitors in IC chips according to embodiments of the invention. In FIG. 4, a substrate is provided that has at least one layer of insulating material and at least one metal-filled trench or via. In embodiments of the invention there are additional metal-filled trenches or vias proximate to the surface of the insulating material. Optionally, there is also an etch-stop layer on the surface of the insulating material. A dense or ultradense etchstop layer as described herein is deposited on the insulating material or etchstop layer. In embodiments of the invention, the dense or ultradense etchstop layer is deposited by atomic vapor deposition. A well is then formed through the dense or ultradense etchstop layer and the optional conventional etchstop layer in the insulating material. The well makes contact with the at least one metal-filled trench or via. A layer of conducting material is deposited on the substrate and the sides and bottom of the well. A sacrificial material (such as a SLAM) is then deposited into the well filling the well and the substrate surface is planarized removing the conducting material and the sacrificial material from the substrate surface, but not from the well. The sacrificial material and the conducting layer are then partially etched, recessing the sacrificial material and the conducting layer within the well. It was found that the dense or highly dense dielectric layer is capable of protecting proximate metal-filled trenches in an uppermost insulating layer during etching of the sacrificial material and conducting layer to recess them into the well. The sacrificial material is then removed from the well. Layer(s) insulating material and then conducting material are deposited. The final conducting material is deposited at a thickness that fills the well. The surface of the substrate is then planarized down to the dense or ultradense etchstop layer leaving the dense or ultradense etchstop layer on the surface. The outlet side of the capacitor structure that has been formed is also on the surface of the substrate. The outlet side of the capacitor comprises a surface of the formed inner conducting region of the capacitor that is capable of making electrical contact with additional conducting regions (such as trenches or vias) that are subsequently formed on the substrate surface that comprises the dense or ultradense etch-stop layer. The substrate undergoes further processing to form additional structures on the substrate surface.

In general, a high-k material is a material that has a dielectric constant greater than that of silicon dioxide. The dielectric constant of silicon dioxide is 3.9.

Components of devices shown herein may comprise additional layers, such as liner and adhesion layers that separate layers comprising different materials, such as, for example, metal layers from insulating layers, and components illustrated as one layer for simplicity, can comprise a plurality of layers of the same or a different material depending, for example, on the manufacturing processes employed in constructing the device and the desired properties of the device.

Implementations of the invention are housed on a substrate, such as a semiconductor substrate. The substrate base on which semiconductor devices are built is typically a semiconductor wafer that is diced apart to yield individual IC chips. The base substrate on which an IC chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and or other group III-V materials either alone or in combination with silicon or silicon dioxide or other insulating materials. Layers and layers comprising devices can also be described as the substrate or part of the substrate on which embodiments of the invention are housed or fabricated.

Figure 5:
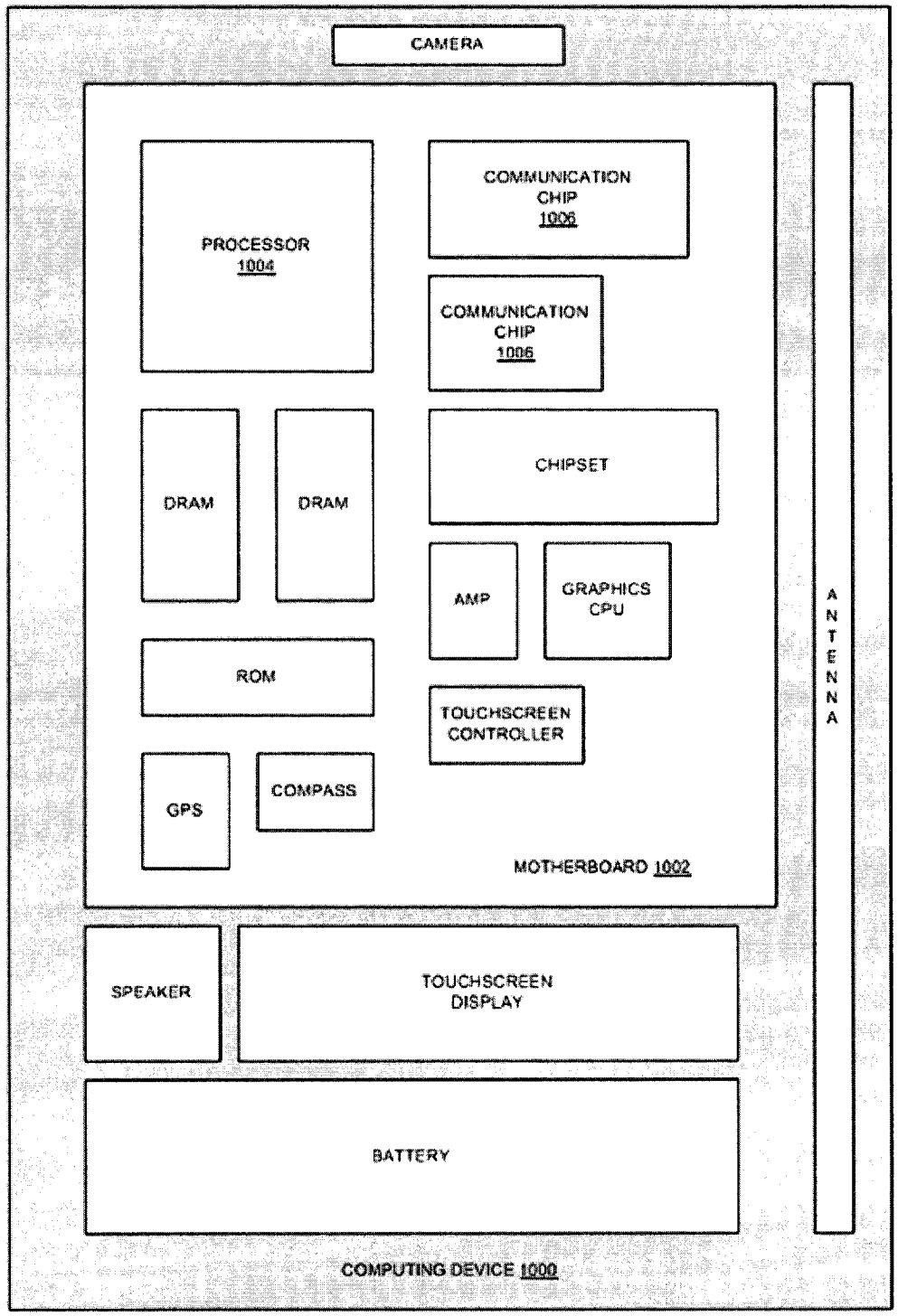
FIG. 5 is a computing device built in accordance with an implementation of the invention.

FIG. 5 illustrates a computing device 1000 in accordance with one implementation of the invention. The computing device 1000 houses a motherboard 1002. The motherboard 1002 may include a number of components, including but not limited to a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as capacitors, that are formed in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as capacitors, DRAM, or eDRAM, that are formed in accordance with implementations of the invention.

In further implementations, another component housed within the computing device 1000 may contain an integrated circuit die that includes one or more devices, such as capacitors, DRAM, or eDRAM that are formed in accordance with implementations of the invention.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In the previous description, numerous specific details are set forth, such as layouts for capacitor arrays and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and or structures may be included and or described features may be omitted in other embodiments.

I claim:

1. A semiconductor device comprising,
a substrate having at least one dielectric layer disposed on the substrate surface;
a first dielectric etchstop layer and a second dielectric etchstop layer disposed on the dielectric layer, wherein the second dielectric etchstop layer is disposed directly on the first dielectric etchstop layer; and
a well formed through the first and second dielectric etchstop layers and in the at least one dielectric layer, wherein the well comprises inwardly tapered sidewalls and a bottom, and a first layer of conducting material is disposed on the inwardly tapered sidewalls and bottom of the well, an insulating layer disposed on the first layer of conducting material, and a second layer of conducting material disposed on the insulating layer.

2. The semiconductor device of claim 1, wherein the second dielectric etchstop layer has a density that is greater than the first dielectric etchstop layer and a density that is greater than 3 g/cm$^3$.

3. The semiconductor device of claim 2, wherein the density of the second dielectric etchstop layer is in the range of 4 to 10 g/cm$^3$.

4. The semiconductor device of claim 1, wherein the first layer of conducting material is recessed relative to the inwardly tapered sidewalls of the well.

5. The semiconductor device of claim 1, wherein the substrate comprises at least two dielectric layers, the dielectric layers are separated by an etchstop layer, and the second dielectric layer comprises a metal-filled trench or via that makes electrical contact with the first layer of conducting material.

6. The semiconductor device of claim 5, wherein the metal-filled trench or via is in electrical contact with a transistor structure.

7. The semiconductor device of claim 1, wherein the first dielectric etchstop layer is comprised of a dielectric material that is comprised of at least 95% silicon, carbon, nitrogen, oxygen, or combinations thereof.

8. The semiconductor device of claim 1, wherein the second dielectric etchstop layer is comprised of a transition metal oxide.

9. The semiconductor device of claim 1, wherein the second dielectric etchstop layer is comprised of a material selected from the group consisting of ZnO, HfO$_2$, Al$_2$O$_3$, and TiO$_x$.

10. The semiconductor device of claim 1, wherein the second dielectric etchstop layer is comprised of a high-k material.

11. A method of fabricating a semiconductor device, the method comprising,
forming at least one dielectric layer on a substrate surface;
forming a first dielectric etchstop layer and a second dielectric etchstop layer on the dielectric layer, wherein the second dielectric etchstop layer is formed directly on the first dielectric etchstop layer;
forming a well formed through the first and second dielectric etchstop layers and in the at least one dielectric layer, wherein the well comprises inwardly tapered sidewalls and a bottom;
forming a first layer of conducting material on the inwardly tapered sidewalls and bottom of the well
forming an insulating layer on the first layer of conducting material; and
forming a second layer of conducting material on the insulating layer.

12. The method of claim 11, wherein the second dielectric etchstop layer has a density that is greater than the first dielectric etchstop layer and a density that is greater than 3 g/cm$^3$.

13. The method of claim 12, wherein the density of the second dielectric etchstop layer is in the range of 4 to 10 g/cm$^3$.

14. The method of claim 11, further comprising:
recessing the first layer of conducting material relative to the inwardly tapered sidewalls of the well.

15. The method of claim 11, wherein the substrate comprises at least two dielectric layers, the dielectric layers are separated by an etchstop layer, and the second dielectric layer comprises a metal-filled trench or via that makes electrical contact with the first layer of conducting material.

16. The method of claim 15, wherein the metal-filled trench or via is in electrical contact with a transistor structure.

17. The method of claim 11, wherein the first dielectric etchstop layer is comprised of a dielectric material that is comprised of at least 95% silicon, carbon, nitrogen, oxygen, or combinations thereof.

18. The method of claim 11, wherein the second dielectric etchstop layer is comprised of a transition metal oxide.

19. The method of claim 11, wherein the second dielectric etchstop layer is comprised of a material selected from the group consisting of ZnO, HfO$_2$, Al$_2$O$_3$, and TiO$_x$.

20. The method of claim 11, wherein the second dielectric etchstop layer is comprised of a high-k material.

21. The device of claim 17 wherein the second etchstop layer is comprised of a material selected from the group consisting of ZnO, HfO$_2$, Al$_2$O$_3$, and TiO$_x$.

* * * * *